(12) United States Patent
Kappes et al.

(10) Patent No.: US 7,046,097 B2
(45) Date of Patent: May 16, 2006

(54) HIGHLY STABLE INTEGRATED TIME REFERENCE

(75) Inventors: Mike Kappes, San Diego, CA (US); Terje Gloerstad, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/069,368

(22) Filed: Mar. 1, 2005

(65) Prior Publication Data

US 2005/0168294 A1    Aug. 4, 2005

Related U.S. Application Data

(60) Continuation of application No. 10/052,856, filed on Jan. 18, 2002, now Pat. No. 6,639,479, and a division of application No. 10/695,180, filed on Oct. 28, 2003, now Pat. No. 6,882,235.

(51) Int. Cl.
*H03B 5/20* (2006.01)
(52) U.S. Cl. ...................... 331/135; 331/36 C
(58) Field of Classification Search ............... 331/135, 331/111, 36 C, 179, 177 R, 137
See application file for complete search history.

(56) References Cited

U.S. PATENT DOCUMENTS

| 4,200,863 | A | * | 4/1980 | Hodges et al. | 341/156 |
| 5,180,991 | A | * | 1/1993 | Takashima | 331/1 A |
| 5,581,252 | A | * | 12/1996 | Thomas | 341/144 |
| 5,675,340 | A | * | 10/1997 | Hester et al. | 341/156 |
| 6,639,479 | B1 | * | 10/2003 | Kappes et al. | 331/135 |

* cited by examiner

*Primary Examiner*—Henry Choe
(74) *Attorney, Agent, or Firm*—Garlick Harrison & Markison, LLP; James A. Harrison

(57) ABSTRACT

An integrated oscillator that may be used as a time clock includes circuitry that oscillates about an RC time constant, which RC time constant is adjustable to provide a desired frequency of oscillation. More specifically, the oscillator includes a capacitor array that has a plurality of capacitors coupled in parallel wherein each capacitor may be selectively included into the RC time constant or selectively excluded there from. Rather than setting the capacitance values to a desired capacitance value, a system for adjusting the time constant includes circuitry for measuring an output frequency and for comparing that to a certified frequency source wherein the time constant is adjusted by adding or removing capacitors from the capacitor array until the frequency of the internal clock matches an expected frequency.

15 Claims, 4 Drawing Sheets

HIGHLY STABLE INTEGRATED TIME REFERENCE

CROSS-REFERENCE TO RELATED APPLICATIONS

This application is a continuation of and claims priority to U.S. Utility application Ser. No. 10/052,856, filed Jan. 18, 2002, now U.S. Pat. No. 6,639,479 having a title of "A Highly Stable Integrated Time Reference" and U.S. Divisional application Ser. No. 10/695,180, filed Oct. 28, 2003, now U.S. Pat. No. 6,882,235, also having a title of "A Highly Stable Integrated Time Reference" which applications are incorporated herein by reference in its entirety for all purposes.

BACKGROUND

1. Technical Field

The present invention relates to time reference sources and, more particularly, integrated time references within a device for use either as a clock reference or calibration master in a master-slave continuous-time filter system.

2. Related Art

Integrated time references are essential in integrated devices and are used for many purposes including synchronization of internal operations, synchronization with buses and external networks among other applications. For example, for a device that communicates over an external synchronized bus, it is important that the device has an internal time reference that it can use to detect and respond to the signals on the bus. Generally, synchronized buses require that all operations happen at specified instants in time. Thus, a device must not only be able to read the synchronized signals being received on the bus, but must also be able to transmit at specified instants in a synchronized manner.

Crystal oscillators have long been used to provide very accurate time keeping functions as result of their steady and predictable response to physical or electrical stimuli. Integrated circuits, however, by their very nature, cannot incorporate an internal crystal oscillator. Accordingly, integrated circuit oscillators are often designed using integrated resistors and capacitors to achieve an RC time constant based oscillation. One problem with this approach, however, is that RC time constants vary significantly according to the tolerance of the resistors and capacitors configured to provide the RC time constants. It is, therefore, difficult to design RC time constant circuits for which their operation is predictable and reliable.

In cases where integrated components are required to achieve accuracy, for example, to enable predictable filter response to be achieved, a more stable external device may be used as a reference. There are times, however, where it is disadvantageous to have a device or integrated circuit be coupled to receive precise frequency signals from an accurate external source.

Accurate internal time keeping is needed, for example, by analog-to-digital converter (ADC) circuits. ADC's are complex analog-to-digital converters that are often used to digitize analog wave forms, for example, voice wave forms, as a part of converting a voice signal to a digital signal that may be manipulated, stored or transmitted over a wireless medium.

The conversion of the voice signal from analog to digital will be most accurate and most reproducible if the sampling occurs at precise and constant measures of time. Moreover, internal synchronized buses, for another example, also require accurate time keeping so that a receiver can properly determine when to latch a data signal. A transmitter must be able to accurately drive a signal on a synchronized bus. Thus, for these and many other reasons, a need exists not only for internal time sources that may be used as a reference signal, but also for accuracy.

SUMMARY OF THE INVENTION

A reference voltage is used to generate a current that is proportional to the conductance of a resistor, or transconductor element, where it is then conducted into a circuit in which the current is integrated onto a discharged capacitor. The voltage across the capacitor is compared with the reference voltage by a comparator wherein a reset is triggered whenever the voltage integrated onto the capacitor exceeds the reference voltage. The reset signal is fed back into a switch that resets the integration capacitor and repeats the integration on the same capacitor or in a closely matched second capacitor. Accordingly, the resistor capacitor pair forms an RC time constant that, coupled with the comparator, serves to create a stable oscillator. In order to obtain a stable time reference with the desired oscillation frequency, a capacitor array is utilized not to provide a desired capacitance, but rather to provide an adjustable time constant to create an oscillation of the desired frequency.

A method of the present invention includes a process for adjusting the RC time constant to obtain a time reference that matches a master reference. More specifically, the method includes, in a processing unit, generating control signals to cause a mid-level capacitance value to be set. Thereafter, the capacitance values are adjusted either upwards or downwards according to the difference in the frequency between the clock driven by the RC time constant and the master source.

In one embodiment of the present invention, an RC oscillator has its clock values driven into a counter that resets the counter value after a specified number of clock cycles. For example, in one embodiment of the invention, the counter value is reset every 1,000 clock cycles. Each time the counter value is reset, it also sends a reset signal to a master counter that receives clock signals from a master clock to which the RC oscillator is being calibrated. When the master counter receives the reset signal, it generates an external count value that is used by the calibration logic to adjust the frequency of the RC oscillator.

For example, since the RC oscillator's counter is reset after 1,000 clock cycles, its frequency is too high if the master counter value is less than 1,000 clock cycles. Conversely, if the master counter has a higher value than 1,000, the RC oscillator clock frequency is too low. Based upon that information, a calibration logic circuit adjusts the capacitance (and, therefore, RC time constant within the RC oscillator) to increase or decrease the oscillation frequency as is necessary. More specifically, the calibration logic generates control commands to add or delete switched capacitors to a capacitor array that creates the RC time constant.

The specific logic that is implemented by the calibration logic for adjusting the capacitance may vary from system to system. In the present system, however, the calibration logic is optimized to reduce the number of iterations that is required to achieve an RC oscillator frequency that most closely matches the frequency of the master clock. Accordingly, the calibration logic examines the remaining amount of capacitance that may be changed and adjusts that capacitance value by a value that approximately equals half of that capacitance amount that may be adjusted.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Generally, the present invention provides a semiconductor-based integrated time reference that provides reliable and precise time keeping. A capacitor array with switched (selectable) capacitors is used to adjust an RC time constant of an oscillator to provide a desired frequency of oscillation.

Figure 1:
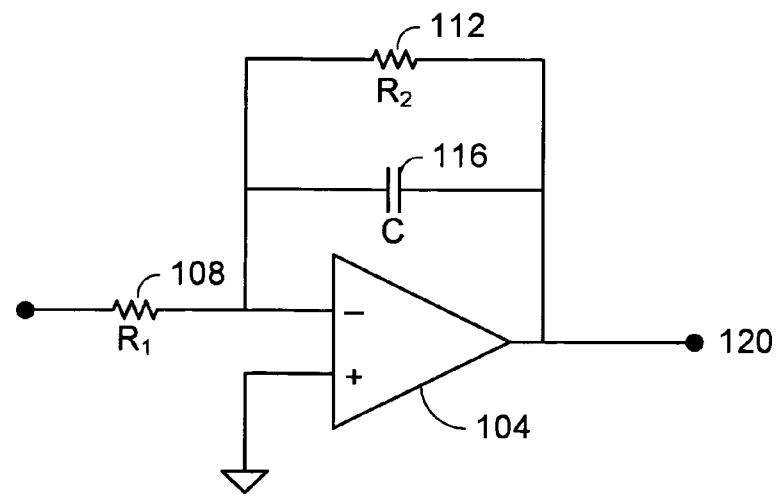
FIG. 1 is a schematic diagram illustrating one known design for creating an oscillator with an RC time constant.

FIG. 1 is a schematic diagram illustrating one known design for creating an oscillator with an RC time constant. As may be seen, an amplifier 104 is coupled to receive a resistor 108 at an input terminal. Additionally, the amplifier has a resistor 112 and a capacitor 116 that are coupled and parallel relative to each other. They also are connected across the negative input terminal that received resistor 108 and an output terminal 120. In theory, the design of FIG. 1 serves to generate an RC time constant that could be built into or integrated onto a silicon device or integrated circuit. A problem with the design of FIG. 1, however, is that resistors typically have a 20% tolerance, while capacitors typically have a 10% tolerance in value in many integrated circuits.

While these tolerances are not out of range even for ordinary discrete components, they are more common in microprocessors and other integrated circuits due to the on-chip processes that are followed for creating resistors and capacitors. For example, capacitors are often implemented from fringe capacitance that is found on metal plates within the integrated circuit. Because of the large tolerance of the components, it is very difficult to design a clock based on an RC time constant whose frequency may not be accurately predicted as a result of the variation of the RC time constant.

Figure 2:
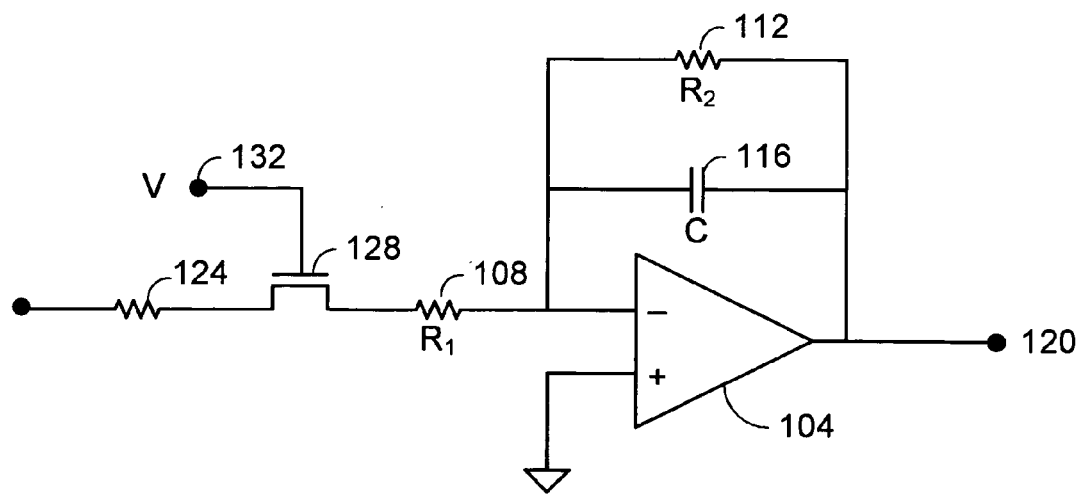
FIG. 2 illustrates an alternate and improved prior art design to FIG. 1 for creating a more predictable RC time constant.

FIG. 2 illustrates an alternate and improved prior art design to FIG. 1 for creating a more predictable RC time constant. As may be seen by referring to FIG. 2, amplifier 104 includes the same capacitor 116 that crosses the negative input terminal and its output terminal 120. It further includes resistor 108, as shown in FIG. 1. Additionally, capacitor 116 is coupled and parallel with resistor 112, as shown in FIG. 1. The difference between FIG. 2 and FIG. 1 may be seen by examining resistor 124 and MOSFET 128. MOSFET 128 is used to provide selectable and adjustable resistance between resistors 124 and 108. By increasing the gate voltage that is received at node 132, the channel conductance of the MOSFET may be varied to increase or decrease the resistance.

The schematic of FIG. 2 is beneficial in that MOSFET 128 may be adjusted to deliver a precise value of resistance not withstanding the variation that results from the on-chip processes. A problem with the design of FIG. 2, however, is that voltage fluctuations, as received at node 132, result in variations in the RC time constant which, in turn, result in a clock having a non-stable output frequency. Accordingly, a scheme similar to FIG. 2 in which the resistance is varied to create a predictable RC time constant is not preferred.

Figure 3:
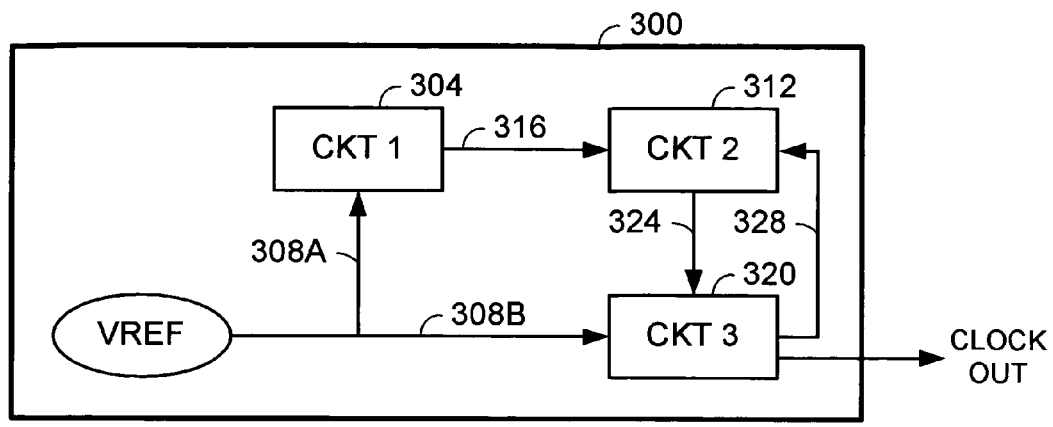
FIG. 3 is a functional block diagram illustrating one embodiment of the present invention.

FIG. 3 is a functional block diagram illustrating one embodiment of the present invention. In prior art systems, the individual components are modified to achieve as close to the desired and calculated value as possible to create a calculated time constant. Thus, for example, if a design calls for a resistor having a first value and a capacitor having a second value, then the components are manufactured to be as close as possible in value to the first and second values. Additionally, as the circuit is completed and built, those values are modified to achieve a desired value. For example, as was described in relation to FIG. 2, the resistance from a MOSFET is often varied to produce a resistance value that closely approximates the calculated value. In the present invention, as will be seen from the discussion of FIG. 3, however, the components are not varied to reach specified resistance or capacitance values, respectively. Rather, the capacitance is modified in contrast to a measured output frequency or time constant produced by the particular device to achieve the desired performance.

A circuit 304, of the clock 300, is coupled to receive a reference voltage over line 308A. In the circuit of FIG. 3, circuit 304 is a transconductor element, by way of example, a resistor. A proportional current is then output from circuit 304 and is produced to circuit 312 over line 316. Circuit 312 comprises a capacitor array whose capacitance may be adjusted as required. The voltage across the capacitor is then produced to a third circuit 320 over a line 324 wherein that voltage is compared to the reference voltage received on line 308B. When the voltage across the capacitor array of circuit 312 matches the reference voltage, circuit 320 generates a clock trigger signal (a reset signal) to circuit 312 over line 328. The capacitor array of circuit 312, upon receiving the reset signal on line 328, discharges the capacitor array to reinitiate the build-up of charge thereon. The frequency of the oscillation produced from iterations of this cycle vary according to the time constant that results from the product of the resistance of circuit 304 and the adjustable capacitance of circuit 312. As is known by those skilled in the art, a time constant for a capacitor is defined as the amount of time that is required for the device to charge up from an uncharged state to a state of being 63.2% charged.

The functional block diagram of FIG. 3 illustrates one principal of the invention herein, in which a capacitor is reset whenever a reference voltage equals the charge voltage on the capacitor. Depending upon designer implementation, since a true time constant revolves around the amount of time of a capacitor being charged to reach 63.2% of its full charge from its relative starting point, the actual amount of time that may be required for the capacitor array of circuit 312 to fully charge could be quite long and lead to a much lower frequency clock output than desired. Accordingly, circuit 3 may include a transconductance element similar to circuit 1 on its input side either in-line or internally, to cause its input voltage that is being used for comparison purposes to be lower than the actual reference voltage so as to match the charge of the capacitor of circuit 2.

In general, the resistor and capacitor values may be varied to create an output clock frequency that is desired. In the present invention, one advantage that is obtained is that the specific components do not have to be matched exactly and do not have to be adjusted to reach a certain value. Rather, they are adjusted until a specified frequency is obtained. Accordingly, the values, while they may vary in tolerance from design, are actually being calibrated to create an RC time constant as a function of their real value as opposed to a design value.

Figure 4:
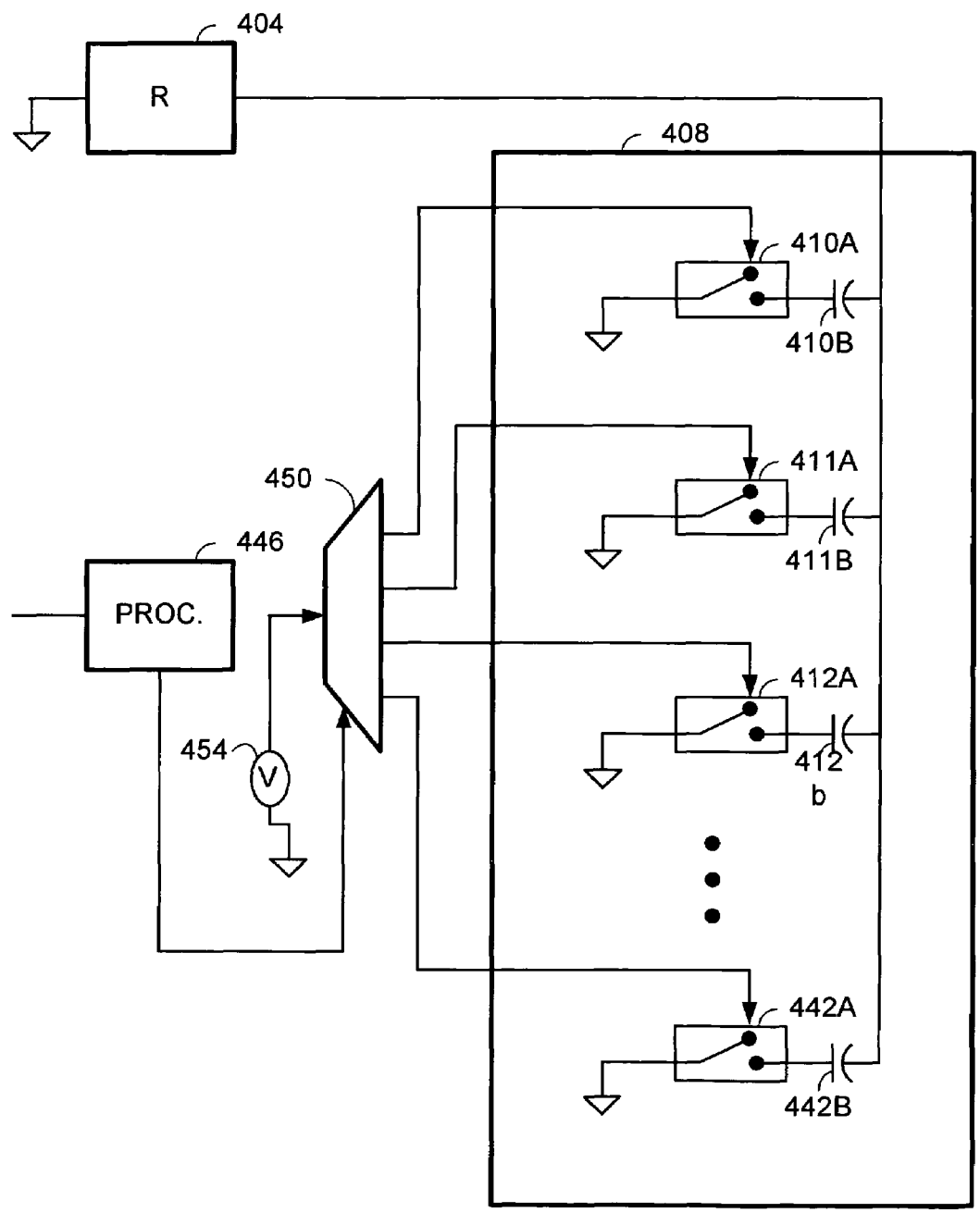
FIG. 4 is a functional block diagram illustrating one embodiment for modifying RC time constants for an oscillator clock according to one embodiment of the present invention.

FIG. 4 is a functional block diagram illustrating one embodiment for modifying RC time constants for an oscillator clock according to a described embodiment of the present invention. As may be seen, a resistive element 404 is coupled in parallel with a plurality of capacitors formed within a capacitor array 408. Capacitor array 408, in the example shown, includes capacitors that are each coupled in series with a switch that may be selectively activated. Thus, switch 410A is coupled in series with capacitor 410B, switch 411A is coupled to capacitor 411B, switch 412A is coupled to capacitor 412B and switch 442A is coupled in series with capacitor 442B. In the described embodiment of the present invention, capacitor array 408 includes 32 capacitors coupled in series with selectable switches.

The switches are driven by software instructions executed by a processor or, alternatively, by a logic circuit. Thus, as may be seen, a voltage source is coupled to the input of the multiplexor 450, which voltage is for driving any and all of the selected switches 410A through 442A. It is understood that the demultiplexor 450 is shown in FIG. 4 to illustrate that any one combination of the switches 410A through 442A may be selected. An actual system may not implement a demultiplexor but alternatively could use other known methods for selecting each of the switches 410A through 442A.

One requirement for the design that is employed is that any number of the 32 switches shown within capacitor array 408 may be selected, including all of them being selected at once.

A processor 446 is coupled to a demultiplexor 450 that is for selecting at least one of the switches 410A through 442A for coupling the corresponding capacitor 410B through 442B to resistive load 404 in a parallel manner. Processor 446 generates control commands to demultiplexor 450 to select any combination of the capacitors within capacitor array 408 to create a time constant that causes oscillator circuitry to produce a signal having a frequency that closely matches the frequency of a master or external clock source (a desired frequency). Thus, as may be seen, a voltage source 454 is coupled to the input of the multiplexer 450 which voltage is for driving any and all of the selected switches 410A through 442A. It is understood that the demultiplexer 450 is shown in FIG. 4 to illustrate that any one of the switches 410A through 442A may be selected.

Figure 5:
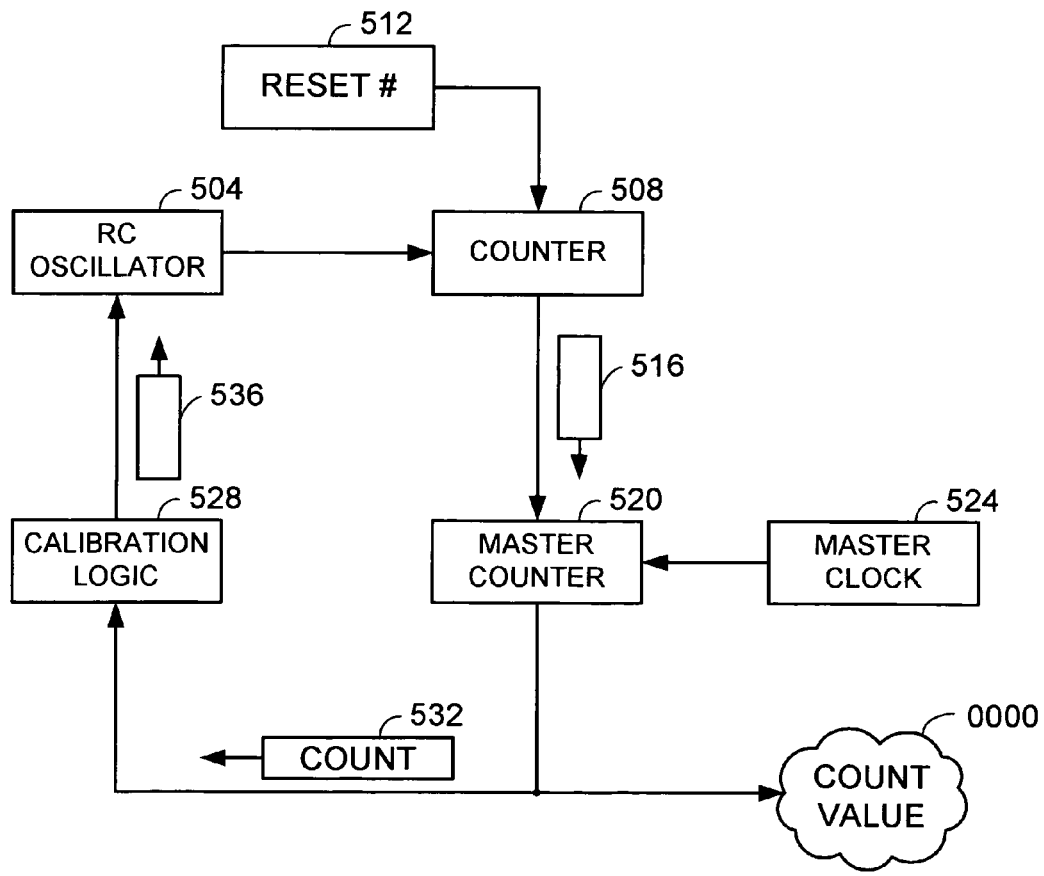
FIG. 5 is a functional block diagram that illustrates a system for calibrating an RC oscillator according to one embodiment of the present invention.

FIG. 5 is a functional block diagram that illustrates a system for calibrating an RC oscillator according to one embodiment of the present invention. The system shown generally at 500 includes an RC oscillator 504 that is coupled to produce clock pulses to a counter 508. A register 512 is coupled to produce a reset number to counter 508, as well. Whenever the counter 508 receives a clock pulse from RC oscillator 504, it increments its counter value until the counter value is equal to the reset number received from register 512. When the two numbers are equal, counter 508 generates a reset signal 516.

A master counter 520 is coupled to receive the reset signal 516. Master counter 520 further is coupled to receive clock pulses from a master clock 524. Master counter 520 counts the clock cycles received from master clock 524, therefore, until the reset signal 516 is received. Once the reset signal 516 is received, master counter 520 generates a count value that is transmitted to calibration logic circuitry 528. The count value is transmitted in a count signal 532. The calibration logic 528, upon receiving the count value in count signal 532, is operable to determine whether the RC time constant should be adjusted within RC oscillator 504. For example, if the master counter value, as specified in signal 532, is a number that is greater than 1,000 clock cycles, that suggests that the RC oscillator has a time constant that is too low and that it is taking too long for it to generate 1,000 clock cycles. Conversely, if the count value in signal 532 is less than 1,000, then the time constant in the RC oscillator 504 is too short and it is generating clock cycles at a higher frequency than is desired. Accordingly, calibration logic will generate a calibration code 536 that is produced to RC oscillator 504 to prompt RC oscillator to vary the time constant accordingly. Thus, for example, if the RC time constant is too low, then additional capacitance will be switched into the RC time constant through a capacitor array, as has been described herein. The process continues until such time that the RC time constants within RC oscillator are adjusted to match, or nearly match, the frequency of the master clock.

Figure 6:
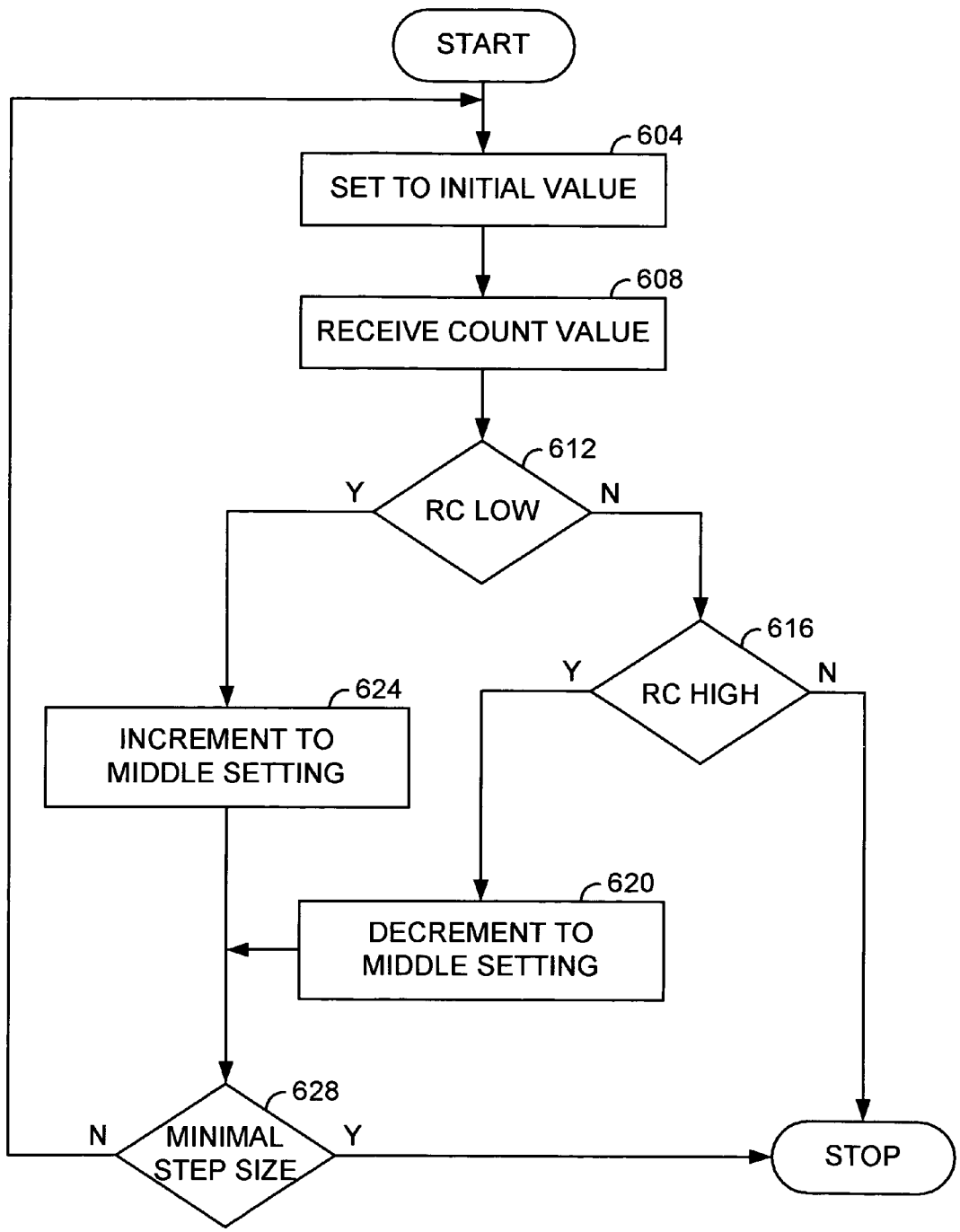
FIG. 6 is a flowchart that illustrates a method for adjusting the RC time constant in an RC oscillator according to one embodiment of the present invention.

FIG. 6 is a flowchart that illustrates a method for adjusting the RC time constant in an RC oscillator according to one embodiment of the present invention. Initially, a calibration logic circuit will set the RC time constant to an initial value (step 604). For example, the RC oscillator 504 of FIG. 5 includes a capacitor array that has 32 capacitors within it. Thus, for an initial RC time constant value, the calibration logic circuit 528 of FIG. 5 will set the capacitor array to include one or more capacitors that will yield a total capacitance value that is one-half of the total capacitance of the array.

Thereafter, the calibration logic circuitry receives a count value (step 608). The count value, for example, is the value received in signal 532 of FIG. 5. From the count value, the calibration logic circuitry determines whether RC time constant is low (step 612). If the RC time constant is not low, then the calibration logic circuitry determines if the RC time constant is too high (step 616). If it is not too high, as determined in step 616, then the process is finished. Because the RC time constant was neither low nor high, it may be assumed that the value is correct.

If, on the other hand, the calibration logic circuitry determines that the RC time constant is high, then it decrements the RC time constant to reduce the capacitance from the present value to a value that is halfway between that present value and the lowest value remaining (step 620). After reducing the capacitance by switching out capacitors in the capacitor array of the RC oscillator, the calibration logic circuitry determines whether the last step was a minimal step size (step 628). Minimal step size is interpreted to mean that the capacitance was changed merely by the addition or removal of only one capacitor. If the step size was not a minimal size, then the process is repeated continuously until a final value is reached, as determined by the step being a minimal step size in 628.

Alternatively, the process is repeated until the RC time constant value is correct. Going back to step 612, if the calibration logic circuitry of FIG. 5 determines that the RC time constant is low, then it increments the RC time constant to a value that is in the middle of the possible number of values that remain. For example, the capacitance of the capacitor array is increased to a value that is halfway from the present point to the maximal amount of capacitance that remains to be added. After the capacitance is increased or incremented in step 624, then the calibration logic examines whether the step size was a minimal step size (step 628).

The inventive method and apparatus disclosed herein are particularly advantageous in that they provide for a reliable and accurate clock that may be built in an integrated circuit. More specifically, the invention herein allows for the RC time constant of an RC-based oscillator to be adjusted such that the oscillations of the clock are at a desired frequency with a high degree of accuracy. Thus, the invention is advantageous in that it avoids the common pitfalls that result from component tolerances that result from typical manufacturing processes.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An apparatus for an RC oscillator, comprising:
    an RC oscillator operable to produce clock pulses;
    a first counter operably coupled to receive the clock pulses wherein the counter includes logic to generate a reset signal when a specified number of clock pulses is received;
    a second counter operably disposed to receive the clock pulses from the RC oscillator and the reset signal from the first counter wherein the second counter generates a count value based upon receiving the reset signal and transmits the count value in a count signal; and
    reset calibration circuitry operably disposed to receive the count value in the count signal generated by the second counter wherein the reset calibration circuitry is operable to determine whether an RC time constant should be adjusted within the RC oscillator.

2. The apparatus of claim 1 further including a reference voltage source for producing a reference voltage.

3. The apparatus of claim 2 wherein the RC oscillator further includes:
    a transconductor element coupled to receive the reference voltage;
    a capacitive element coupled to receive a proportional voltage output from the transconductor element, the capacitive element comprising a plurality of capacitors, a plurality of which is selectable; and
    a comparator coupled to receive the reference voltage from the voltage reference source and also coupled to receive a voltage that is across the terminals of the capacitor circuitry wherein the comparator generates a reset signal to cause a capacitor circuit to be discharged or reset whenever the voltage across the capacitor circuit matches the reference voltage.

4. The apparatus of claim 3 wherein the comparator circuit includes a resistive element on an input side that is coupled to receive the reference voltage.

5. The apparatus of claim 3 wherein the capacitor circuitry is coupled in parallel to the transconductor element.

6. The apparatus of claim 3 wherein the capacitor circuit comprises more than ten capacitors.

7. A method for generating a stable oscillation, comprising:
    producing clock pulses to first and second counters;
    producing a reset number the counter
    in first the counter, incrementing a counter value until the counter value is equal to a specified reset number and generating a reset signal;
    in the second counter, generating a count value; and
    in a calibration logic circuitry, upon receiving the count value determining whether an RC time constant should be adjusted within an RC oscillator.

8. The method of claim 7 further including;
    producing a reference voltage to a transconductance element;
    generating a current that is proportional to the transconductor element based upon the reference voltage;
    conducting the current into a circuit and to a capacitor;
    integrating the current to form a voltage,
    comparing the voltage across the capacitor with the reference voltage and triggering a reset whenever the voltage integrated onto the capacitor exceeds the reference voltage; and
    producing the reset signal to a switch that resets the integration capacitor and repeats the integration on the same capacitor or in a closely matched second capacitor.

9. The method of claim 8 wherein conducting the current to a capacitor further includes conducting the current to at least one selected capacitor of a capacitor array in order to obtain a stable time reference with the desired oscillation frequency.

10. The method of claim 9 wherein the capacitor array is utilized to provide an adjustable time constant to create an oscillation of the desired frequency.

11. The method of claim 10 further including adjusting the RC time constant to obtain a time reference that matches a master reference.

12. The method of claim 11 further including generating control signals to cause a mid-level capacitance value to be set.

13. The method of claim 12 further including adjusting the capacitance values either upwards or downwards according to the difference in the frequency between the clock driven by the RC time constant and the master source.

14. The method of claim 13 further including resetting a counter value after a specified number of clock cycles.

15. The method of claim 14 further including sending a reset signal to a master counter of a master clock to which the RC oscillator is being calibrated wherein the master counter, upon receiving the reset signal, generates an external count value that is used by the calibration logic to adjust the frequency of the RC oscillator.

* * * * *